United States Patent [19]
Ameen et al.

[11] Patent Number: 6,093,645
[45] Date of Patent: Jul. 25, 2000

[54] ELIMINATION OF TITANIUM NITRIDE FILM DEPOSITION IN TUNGSTEN PLUG TECHNOLOGY USING PE-CVD-TI AND IN-SITU PLASMA NITRIDATION

[75] Inventors: Michael S. Ameen, Phoenix; Joseph T. Hillman, Scottsdale; Douglas A. Webb, Phoenix, all of Ariz.

[73] Assignee: Tokyo Electron Limited, Tokyo, Japan

[21] Appl. No.: 08/965,658

[22] Filed: Nov. 6, 1997

Related U.S. Application Data

[63] Continuation-in-part of application No. 08/797,397, Feb. 10, 1997, Pat. No. 5,906,866, and a continuation-in-part of application No. 08/797,883, Feb. 10, 1997, abandoned.

[51] Int. Cl.$^7$ .................................................. H01L 21/28
[52] U.S. Cl. .................... 438/683; 438/680; 438/642; 438/643; 438/653
[58] Field of Search ..................... 438/642, 655, 438/649, 683, 630, 680, 643, 648, 653; 257/764, 754

[56] References Cited

U.S. PATENT DOCUMENTS

| | | | |
|---|---|---|---|
| 4,962,414 | 10/1990 | Liou et al. | 357/71 |
| 5,162,262 | 11/1992 | Ajika et al. | 437/200 |
| 5,370,739 | 12/1994 | Foster et al. | 118/725 |
| 5,565,708 | 10/1996 | Ohsaki et al. | 257/764 |
| 5,567,243 | 10/1996 | Foster et al. | 118/730 |
| 5,591,671 | 1/1997 | Kim et al. | 437/190 |
| 5,610,106 | 3/1997 | Foster et al. | 437/245 |
| 5,776,830 | 7/1998 | Sumi et al. | 438/643 |
| 5,783,282 | 7/1998 | Leiphart | 428/138 |
| 5,906,866 | 5/1999 | Webb | 427/534 |

*Primary Examiner*—Matthew Smith
*Assistant Examiner*—Victor Yevsikov
*Attorney, Agent, or Firm*—Wood, Herron & Evans, L.L.P.

[57] ABSTRACT

An effective barrier layer to chemical attack of fluorine during chemical vapor deposition of tungsten from a tungsten fluoride source gas is fabricated by the present invention. A titanium nitride conformal barrier film can be formed by in-situ nitridation of a thin titanium film. The substrate is placed in a module wherein the pressure is reduced and the temperature raised to 350° C. to about 700° C. A titanium film is then deposited by plasma-enhanced chemical vapor deposition of titanium tetrahalide and hydrogen. This is followed by formation of titanium nitride on the titanium film by subjecting the titanium film to an nitrogen containing plasma such as an ammonia, an $N_2$ or an $NH_3/N_2$ based plasma. Tungsten is then deposited on the film of titanium nitride by plasma-enhanced chemical vapor deposition. All the titanium deposition and nitridation steps may be conducted in the same processing module without removing the substrate from the module until the reaction steps are completed. The tungsten deposition step may be preformed in a separate processing module or in the module used to deposit and process the titanium.

32 Claims, 3 Drawing Sheets

ELIMINATION OF TITANIUM NITRIDE FILM DEPOSITION IN TUNGSTEN PLUG TECHNOLOGY USING PE-CVD-TI AND IN-SITU PLASMA NITRIDATION

This is a continuation-in-part of U.S. patent application Ser. No. 08/797,397 (now U.S. Pat. No. 5,906,866) and Ser. No. 08/797,883 now abandoned, both entitled "PROCESS FOR CHEMICAL VAPOR DEPOSITION OF TUNGSTEN ONTO A TITANIUM NITRIDE SUBSTRATE SURFACE" and both filed Feb. 10, 1997.

BACKGROUND OF THE INVENTION

Current methods of forming contact and via level metallization using tungsten plug or via fill processes require that the film be deposited in several steps so that good contact/via resistance with reliable film properties are achieved. These steps typically include:

1. Depositing a titanium film to form titanium-silicide and promote good contact resistance between the silicon substrate and the tungsten plug;
2. Depositing a titanium nitride barrier layer so that fluorine liberated in the tungsten deposition step does not etch the existing titanium underlayer; and
3. Depositing a tungsten layer, including a plug, followed by etch-back or chemical mechanical polishing of the tungsten layer. Chemical mechanical polishing is a sacrificial-resist etch-back process which can rapidly remove a layer of film using a buffing wheel in connection with an abrasive slurry and a chemical etchant.

Previously, titanium and titanium nitride typically have been deposited using physical vapor deposition (PVD) methods such as sputtering. Using PVD, thick films of Ti and TiN must be deposited on the top layers of the device in order to achieve adequate bottom coverage.

While sputtering provides deposition of a titanium film at a low temperature, sputtering processes have various drawbacks. Sputtering normally yields very poor step coverage. Step coverage is defined as the ratio of film thickness on the bottom of a contact on a substrate wafer to the film thickness on the sides of the contact or the top surface of the substrate. Consequently, to sputter deposit a predetermined amount of titanium at the bottom of a contact or via, a larger amount of the sputtered titanium must be deposited on the top surface of the substrate or the sides of the contact. For example, in order to deposit a 200 Å film at the bottom of a contact using sputtering, a 600 Å to 1,000 Å film layer may have to be deposited onto the top surface of the substrate or the sides of the contact. Since the excess titanium has to be etched away, sputtering is wasteful and costly when depositing titanium layers.

The step coverage of the contact with sputtering techniques decreases as the aspect ratio of the contact or via increases. The aspect ratio of a contact is defined as the ratio of contact depth to the width of the contact. Therefore, a thicker sputtered film must be deposited on the top or sides of a contact that is narrow and deep (high aspect ratio) in order to obtain a particular film thickness at the bottom of the contact than would be necessary with a shallow and wide contact (low aspect ratio). For smaller device dimensions in an IC, high aspect ratio contacts and vias are used and sputtering is inefficient and wasteful. The decreased step coverage during sputter deposition over smaller devices results in an increased amount of titanium that must be deposited, thus increasing the amount of titanium applied and later etched away. This increases the titanium deposition time, and the etching time that is necessary to remove excess titanium. Accordingly, as IC device geometries continue to shrink and aspect ratios increase, deposition of titanium-containing layers by sputtering becomes very costly.

Sputter deposition also requires the utilization of a separate reaction chamber. In applications where a first film is deposited by chemical vapor deposition (CVD), which is the preferred method, followed by sputter deposition of a second film, two different chambers are required. This may be followed by a third deposition process, such as sputter deposition in a third chamber. It is preferable to minimize the transport of the substrate from one reaction chamber to another and to conduct as many reactions as possible in a single chamber.

As shown in FIGS. 2A–2D, silicon substrate 110 with oxide layer 112 and via or plug 114 are provided. Titanium layer 116, having a thickness of approximately 600 Å, is then deposited by PVD. The PVD-Ti deposition results in Ti "overhang" 116a. Titanium nitride barrier layer 118, having a thickness of approximately 1,200 Å, is then deposited by PVD. The PVD-TiN builds upon Ti overhang 116a to form overhang 118a. Due to the poor step coverage of PVD-TiN, the area 118b under overhang 118a is thin and weak. This weakness results in failure of the TiN barrier layer during deposition of the tungsten plug. The source gas for tungsten layer 120 is tungsten hexafluoride ($WF_6$). During deposition of the tungsten layer 120, fluorine gas is liberated. The fluorine gas is highly reactive with Ti layer 116 found under the TiN barrier layer 118. The reaction of F with Ti layer 116 at area 118b leads to liftoff 122 of the entire film stack. This liftoff 122 is known as a "tungsten volcano" due to the appearance of the failed stack.

It is frequently desired to deposit a film of titanium nitride over a film of titanium. The common method of depositing this film stack is sputtering. CVD Ti and TiN has been offered as a cost-effective alternative to sputtering. Application Ser. No. 08/401,859 (herein incorporated by reference in its entirety), filed Mar. 10, 1995, entitled "Plasma Enhanced Chemical Vapor Deposition of Titanium Nitride Using Ammonia" discloses PE-CVD of titanium nitride using titanium tetrachloride and ammonia. This, however, does not disclose formation of titanium and titanium nitride in a single reaction chamber, but specifically discloses withdrawing the substrate containing the titanium in between formation of the titanium and the titanium nitride films.

There is significant cost associated with each individual process that decreases the throughput of the machine. This includes the time to heat a wafer, stabilize the reaction chamber pressure and gas flows, and stabilize rotation. Each time a wafer enters a module, it must go through all these steps.

Transferring the wafer from station to station causes a time delay between the deposition of the titanium and subsequent nitridation and deposition of the titanium nitride film. During this time, the titanium film will undergo oxidation which can degrade the electrical properties of the film.

Therefore, it is one object of the present invention to provide a TiN barrier layer having no inherent weaknesses. It is another object of the present invention to deposit W plugs without the formation of tungsten volcanos. It is yet another object of the present invention to fabricate a TiN barrier from a Ti layer on a substrate in a single reaction chamber.

SUMMARY OF THE INVENTION

The present invention is a process for eliminating the step of depositing a titanium nitride (TiN) film as an intermediate step between the deposition of titanium (Ti) and the deposition of tungsten (W) in a CVD-W plug application. The present invention uses CVD of Ti to form a conformal precursor barrier level which is followed by an in-situ nitridation step. The in-situ nitridation step is a plasma nitridation which utilizes a nitrogen containing plasma such as an ammonia, an $N_2$ or an $NH_3/N_2$ based plasma to convert the conformal CVD-Ti to TiN. The conformal TiN film is not etched or attacked by the fluorine gas liberated in the CVD-W plug deposition and eliminates the formation of "volcanos" at the contact corners.

U.S. patent application Ser. No. 08,253,978, entitled Low Temperature Plasma-Enhanced Formation of Integrated Circuits, filed Jun. 3, 1994, (Inventor Joseph T. Hillman et al.), herein incorporated by reference in its entirety discloses the application of various films, including PE-CVD Ti.

The present invention provides a titanium film which is subsequently nitrided to form a titanium nitride film followed by the deposition of a W plug to fill a contact or via. The process of forming the barrier can be performed in a single reaction chamber to provide significant increases in productivity and cost efficiency.

According to the present invention, the pressure in the reaction chamber is stabilized at less than about 10 torr, the wafer temperature is then stabilized at a temperature of about 400–700° C. and a titanium film is deposited by plasma-enhanced chemical vapor deposition. Without leaving the reaction chamber, the film is then subjected to plasma nitridation using an nitrogen containing plasma such as an ammonia, an $N_2$ or an $NH_3/N_2$ based plasma to form titanium nitride. Again, without necessarily leaving the reaction chamber, tungsten may be deposited using chemical vapor deposition using tungsten hexafluoride source gas. Alternatively the substrate can be removed from the reaction chamber and directed to a subsequent process module for W deposition, as an example.

These steps result in the formation of a titanium nitride barrier layer for a tungsten plug in a contact or via without having to move or otherwise change the state of the wafer during the process. The advantages of this process over a conventional process are that it reduces the time required to form the titanium nitride and tungsten. This, in turn, improves the throughput of the machine and reduces the cost. Further, this creates the possibility of using a single cluster tool with two or three such modules operating in parallel to further increase the throughput of the tool. Further, the junction properties are improved because there is no delay between the titanium deposition and the nitridation to form titanium nitride, which minimizes contaminants that can degrade the electrical properties.

The objects and advantages of the present invention will be further appreciated in light of the following detailed description and drawings. In which:

DETAILED DESCRIPTION

According to the present invention, a titanium nitride film is formed by nitridation of a titanium film to form a titanium nitride barrier layer. For use in the present invention, the titanium film is deposited using CVD, preferably PE-CVD of titanium, preferably a titanium tetrahalide such as titanium tetrachloride. Subsequent to the deposition of the titanium film, the film is subjected to an in-situ plasma nitridation to form a titanium nitride barrier layer.

Figure 1:
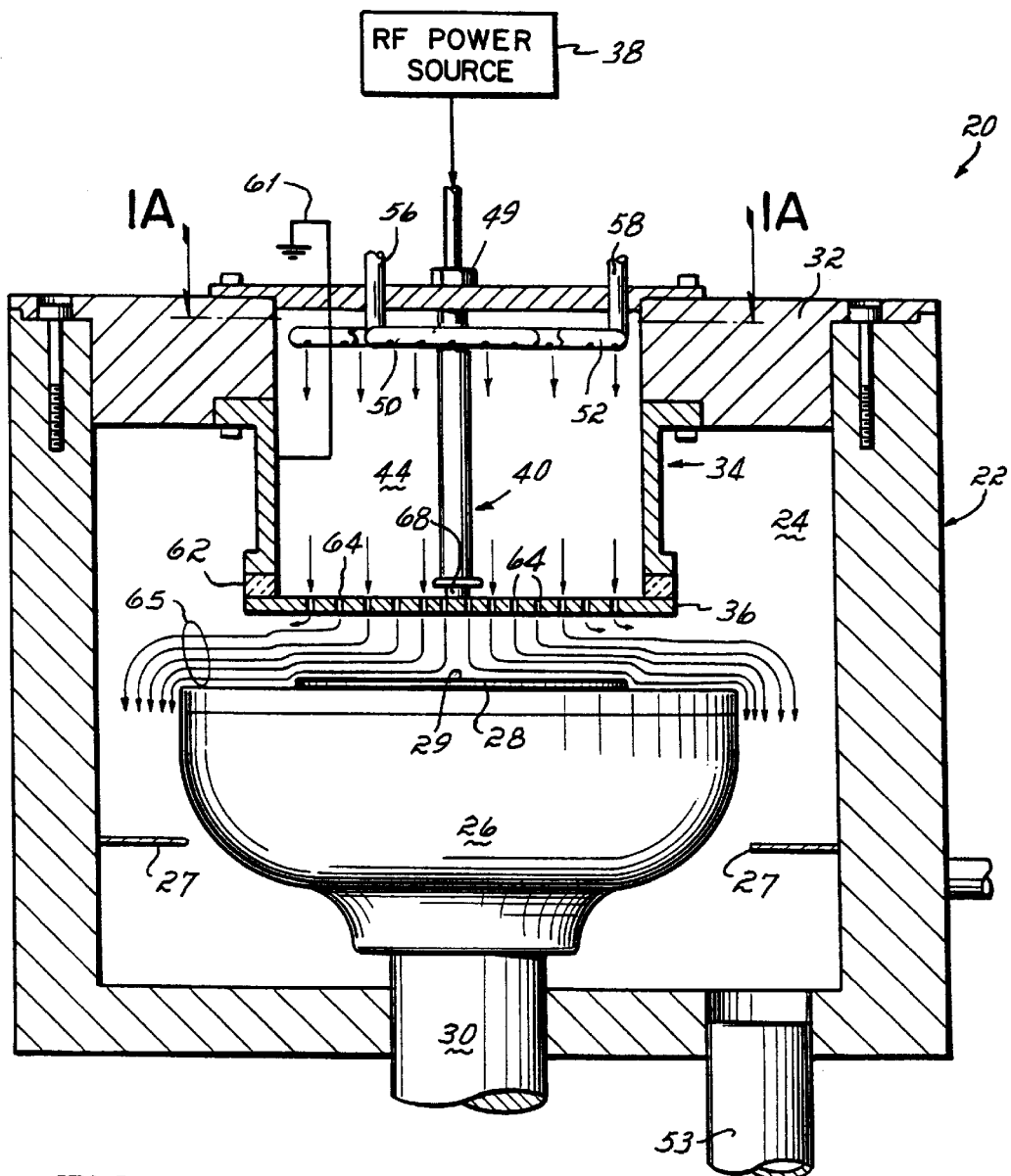
FIG. 1 is a side view, partially in cross-section, of a deposition chamber used to practice the methods of the present invention.
Figure 1A:
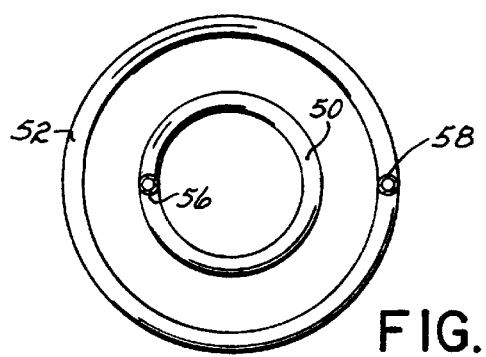
FIG. 1A is a top plane view of the concentric gas injectors taken along line A—A of FIG. 1.
Figure 2A:
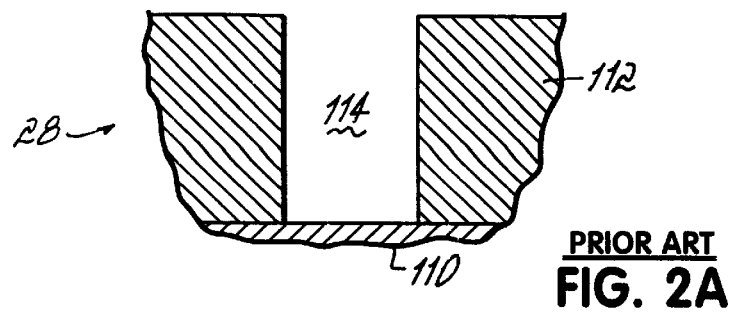
FIG. 2A–FIG. 2D are schematic cross-sections showing the formation of a "Tungsten Volcano."
Figure 2B:
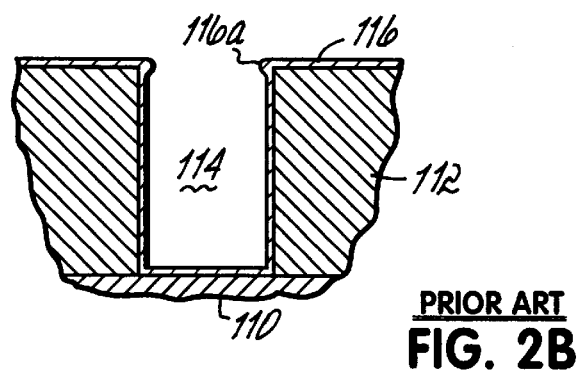
Figure 2C:
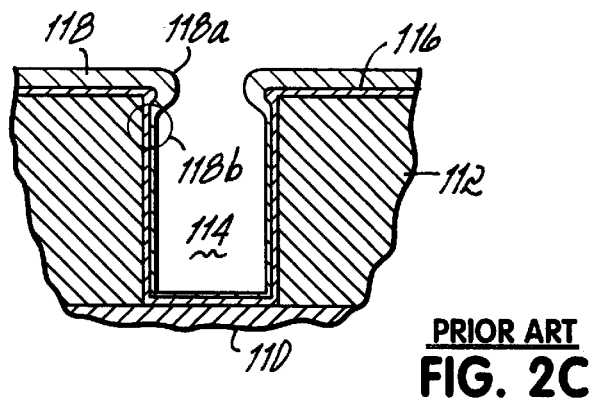
Figure 2D:
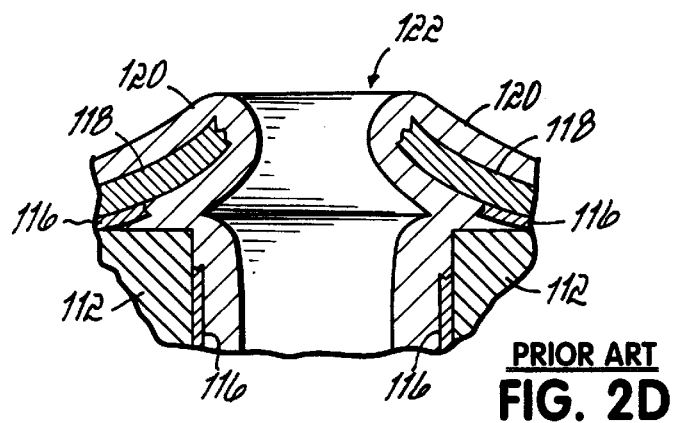

Although not limited to any particular apparatus, one preferred apparatus for use in the present invention is a CVD reactor 20 shown in FIG. 1.

Reactor 20, and specifically reaction space 24 within housing 22, may be selectively evacuated. In this application, the reaction space will be evacuated to 0.5 to 10 torr. Typically, the susceptor 26 is stationary; however, susceptor 26 may be coupled to a variable speed motor (not shown) by shaft 30 such that the susceptor 26 and substrate 28 may be rotated at various speeds such as between 0 and 2,000 rpm. Susceptor 26 includes a resistance heating element (not shown) coupled to the susceptor 26 to heat substrate 28, and includes an electrical ground (not shown).

Extending downwardly from the top wall 32 of housing 22 is a cylinder assembly 34 which is attached to a gas-dispersing showerhead 36. Showerhead 36 is coupled to an RF energy source 38 by an appropriate RF feed line assembly 40 which extends through cover 46 which may, if necessary, include a heat pipe to dissipate unwanted heat. A sealing structure 49 seals the opening around feed line assembly 40. Plasma source gas and reactant gas are introduced into flow passage 44 by concentric rings or halos 50, 52. The concentric rings 50, 52 include a number of holes which evenly dispense the gases around the flow passage 44. Ring 50 is connected to a gas supply through line 56, while ring 52 is connected to a supply by line 58.

Insulator ring 62 separates cylinder 34 and showerhead 36, to electrically isolate one from the other. Cylinder 34 is electrically grounded by ground line 61. The insulator ring 62 preferably has an outer diameter approximately the same as the outer diameter of showerhead 36 and a width which ensures complete separation of cylinder 34 and showerhead 36 along the entire attachment interface between the cylinder and showerhead. The insulator ring is preferably made of quartz material approximately 0.75 inches thick.

Showerhead electrode 36 contains a plurality of dispersion holes 64 which disperse the flow of gas over substrate 28. The showerhead 36 includes a stem 68. Stem 68 is formed integrally with the showerhead 36 and forms part of the RF line assembly 40 which connects to showerhead 36. The showerhead 36, including stem 68, is formed of an electrically conductive material, preferably Nickel-200.

The RF power source, through RF feed line assembly 40, biases the showerhead 36 so that the showerhead functions as an RF electrode. The grounded susceptor 26 forms another parallel electrode. An RF field is created, preferably between showerhead 36 and susceptor 26. The RF field created by the biased showerhead/electrode 36 excites the plasma gases, for example nitrogen, hydrogen and argon gases, which are dispensed through holes 64 so that a plasma is created below showerhead/electrode 36.

The showerhead employed is about 6 mm thick, having a diameter of about 17.3 cm and 600 holes. The number of holes is not critical and could easily be varied from 100 holes to 1,000 or more holes. The holes are preferably less than 1.5 mm in diameter and are more preferably about 0.75 mm. This prevents the plasma from being generated in the hole, which reduces efficiency.

Gas flow injector rings are preferably connected through appropriate valving (not shown) to the following gas supplies: $H_2$, titanium tetrahalide, $N_2$, $NH_3$, Ar, and $WF_6$ (gas supplies not shown) to selectively enable one or more of these gases to be supplied to the cylinder 34. The gas flow from injector rings 50 and 52 is allowed to develop within the length of the cylinder 34 as it travels to the showerhead 36. It is desirable for the velocity profile of the incoming plasma gases passing through showerhead 36 to be fully developed before reaching the surface of the substrate 28. Due to the proximity of the showerhead to the surface, the profile must develop in the cylinder 34.

Preferably, the showerhead 36 can be from about 10 cm to about 10 millimeters from susceptor 26, with 20 mm preferred. It is preferred to have the showerhead as close as possible to the substrate surface 29 while still permitting the substrate or wafer to be removed, although this is not critical for practicing the present invention.

A pumping effect may be created by the rotating susceptor 26, as described in U.S. Pat. No. 5,370,739, which is incorporated herein it its entirety by express reference thereto. The plasma radicals and ions are drawn to the upper surface 29 of substrate 28. Generally, the rotation rate can vary from 0 rpm to 1,500 rpm. Further, matched gas flow does not appear to be critical but can be employed.

With a spacing of about 20 mm between the showerhead and the substrate 28, the created plasma is much closer to the substrate surface 29. With the showerhead 36 acting as an RF electrode, a more uniform plasma is generated, therefore enhancing the uniformity of radical and ion density at the substrate 28 and thereby improving reaction rate.

When employing this apparatus, the electrode is biased generally at a frequency between about 55 KHz and 13.56 MHZ (a frequency which is authorized by the Federal Communication Commission). Initially, the wafer is placed within the reactor 20 and both the temperature and pressure are established and stabilized. A temperature should be selected to optimize the various reactions which will be conducted, and generally should be from 350° C. to about 700° C.

Likewise, the pressure should be established and stabilized initially and then maintained throughout the process. The pressure can be anywhere from about 500 millitorr up to about 10 torr, with about 5 torr being preferred.

Figure 3A:
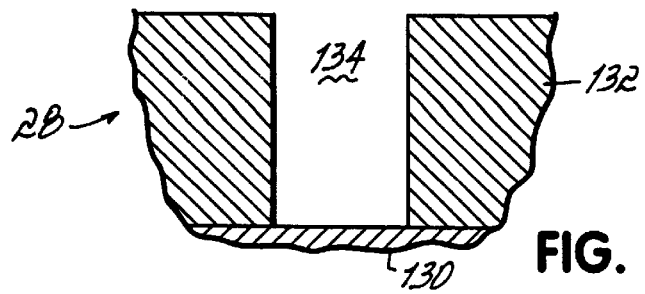
FIG. 3A–FIG. 3D are schematic cross-sections showing the filling of a contact or via with a tungsten plug without the formation of a "Tungsten Volcano."
Figure 3B:
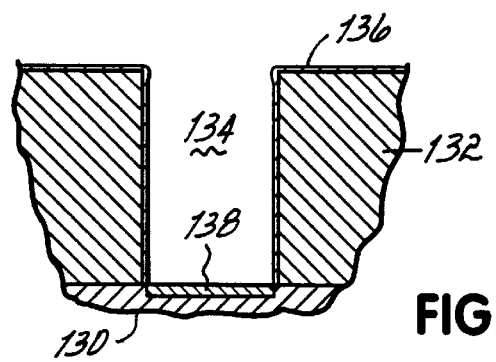
Figure 3C:
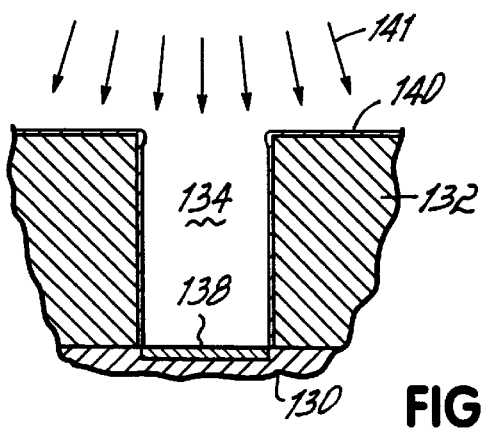
Figure 3D:
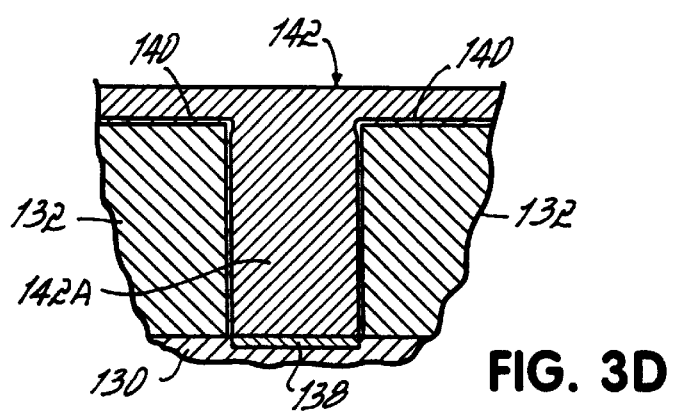

The titanium film is deposited by PE-CVD, as disclosed in U.S. Pat. No. 5,567,243 (herein incorporated by reference). According to this method, titanium tetrahalide is combined with a diluent gas and formed into a plasma using RF energy. The titanium is then deposited upon a substrate 28. The substrate 28, as shown in FIG. 3A, can typically be any semiconductor substrate such as silicon 130 with an oxide layer 132 having contacts or vias 134 (FIG. 3A) to be filled with tungsten plugs 142A (FIG. 3D). The PE-CVD-Ti forms an in-situ $TiSi_2$ layer 138 on Si 130 during deposition of metallic Ti layer 136 on oxide layer 132, as shown in FIG. 3B. The kinetics of the deposition are such that the layer of $TiSi_2$ 138 formed in the Si contact layer 130 is approximately 2–2.5 times the thickness of the layer of metallic Ti 136 formed on the top surface of the oxide 132. For example when a 100 Å layer of metallic Ti 136 is formed on the oxide 132 an approximately 250 Å layer of $TiSi_2$ 138 is formed in the Si contact layer 130. The layer of metallic Ti formed on the vertical surface of the oxide is not as thick as the layer on the horizontal surface of the oxide. The relatively thin layer of Ti is then suitable for nitridation in a nitrogen containing plasma such as an ammonia, an $N_2$ or an $NH_3/N_2$ based plasma. There are other suitable applications in which this process can be used, for example, Ti deposition onto Al or TiN anti-reflective coating layers.

The titanium tetrahalide can be titanium tetrabromide, titanium tetraiodide or titanium tetrachloride. Titanium tetrachloride is preferred due to cost. This titanium source gas is combined with an inert diluent gas, preferably hydrogen. Other inert diluent gases include helium, argon, neon and xenon. Generally, the molecular ratio of diluent to titanium tetrachloride is from about 1:1,500 to about 5:1,500.

The flow rate will vary, depending upon the particular reactor. With the reactor described above, a flow rate of $TiCl_4$ of 3 to 7 sccm is preferred; and a flow rate of hydrogen of 1,000 to 5,000 sccm is preferred. The pressure is preferably about 5 torr.

The RF energy can also be varied, depending upon the particular application. The power of the RF energy can be from about 200 watts to about 1 kilowatt at about 450 KHz to 13.56 MHZ.

As shown in FIG. 1, the substrate is held on a susceptor 26 which can be rotated. The rotation rate can be from about 0 rpm up to about 2,000 rpm. The rotation facilitates a pumping action which draws the gases to the surface of the substrate. Using the present invention, the substrate temperature can be adjusted by adjusting the temperature of the susceptor 26.

The titanium film 136 formed on the oxide layer 132 (FIG. 3B) may optionally be subjected to a hydrogen plasma after deposition. Preferably, the plasma is formed from a gas selected from hydrogen, mixtures of hydrogen and argon, or hydrogen and helium. It is desirable to have at least 1% to 5% hydrogen to react with the halide to form the hydrogen halide, hydrogen chloride if titanium chloride is used as the source gas, which is then vented from the reaction chamber. The hydrogen plasma drives the titanium deposition reaction to completion and eliminates, or at least substantially reduces, chlorides.

During the hydrogen plasma treatment, the RF electrode will operate at about 200 to about 700 watts, with the frequency being from about 450 KHz to 13.56 MHZ. Generally, the flow rate should be about 1,000 sccm. This plasma treatment is continued for a period of 30 to 90 seconds, with about 60 seconds being preferred.

The TiN film 140 (FIG. 3C) is formed from the Ti film 136 (FIG. 3B). Subsequent to the hydrogen plasma treatment, the Ti film 136 is in-situ nitrided with a nitrogen-containing plasma 141 (FIG. 3C) such as an ammonia, an $N_2$ or an $NH_3/N_2$ based plasma. Nitriding gases which can be used in the present invention are ammonia and ions of ammonia and nitrogen with a diluent gas such as a noble gas (preferably argon) or hydrogen. Ammonia is preferred because of its better reactivity. The plasma 141 is created by subjecting the nitriding gas to an RF field created by electrode 36 at an elevated temperature and reduced pressure. When the plasma 141 contacts the titanium film 136, the titanium film 136 is transformed into a titanium nitride film 140 (FIG. 3C).

During the nitriding step, the RF electrode may operate between about 200 to about 700 watts (preferably about 500 watts, with the frequency being between about 100 KHz and 50 MHZ (preferably about 450 KHz). Ammonia gas flow is typically controlled to between about 1,000 to about 5,000 sccm (preferably about 3,000 sccm) and the Ar diluent gas flow is controlled to about 150 sccm with a total pressure of approximately 5 torr. The temperature of substrate 28 is controlled by heating susceptor 26. The substrate is preferably heated to about 600° C.

Generally, the minimum flow rate of the nitridation gas should not be less than about 10 sccm. Although flow rates above 10,000 sccm will function, flow rates above 5,000 sccm increases the amount of unvented gas in the chamber without any substantial increase in the rate of nitriding. Although the precise flow rate of the nitridation gas is not critical for practicing the present invention, about 3,000 sccm is preferred. The nitridation processing time can range from 20 seconds up to ten minutes, however five minutes is generally acceptable.

The nitridation gas, preferably ammonia or a combination of nitrogen and hydrogen, is introduced through injectors 50 and 52 and flows through the cylinder 34 and through showerhead 36, which creates the plasma from the gas. This reaction continues for about five minutes. Unreacted ammonia, along with hydrogen, as shown by arrows 65, will be drawn downwardly around baffles 27 and exit from the reaction chamber 14 through vent 53.

The substrate may then be transported to a tungsten CVD module as disclosed in two U.S. patent application, Serial Nos. 08/797,883 and 08/797,397, both entitled PROCESS FOR CHEMICAL VAPOR DEPOSITION OF TUNGSTEN ONTO A TITANIUM NITRIDE SUBSTRATE SURFACE, and both filed Feb. 10, 1997 (Inventor Douglas A. Webb), herein incorporated by reference in its entirety. The wafer typically undergoes a hydrogen plasma treatment in the chamber of the tungsten CVD to remove any oxized surface layer and to form nucleation sites for the subsequently deposited tungsten. Upon introduction of the $WF_6$ and initiation of the CVD reaction, the nucleation of the tungsten proceeds without degradation and the process does not require a separate sputter etching or other plasma processing module and reduces the preclean processing time. The hydrogen plasma treatment may last between ten seconds and one minute.

Typically, it is more efficient to deposit tungsten in a separate module because the difference in temperature, pressure and gas mixture are sufficient to warrant the delay in changing modules. However, it is possible to perform the tungsten deposition in the processing module used for the deposition and processing of the titanium. In depositing the CVD-W layer, before the flow of the reactant gas containing $WF_6$ into the chamber, hydrogen gas is introduced at a flow rate of 2,000 sccm and at a pressure of 5 torr, with the wafers at temperatures of between 300 and 450° C. A circular parallel plate electrode (not shown) having a diameter of 25 cm is maintained over the substrate at a distance of 20 mm therefrom and energized with 500 watts of RF power at a frequency of 450 KHz. $H_2$ gas flows at a rate of about 2,000 cc/min for a time sufficient to remove any oxidation (typically 10 seconds to 1 minute). $WF_6$ is then added to the $H_2$ flow at a rate of about 300 sccm per minute to produce the tungsten film 142, including plug 142*a* in via 134. One of ordinary skill in the art will appreciate that the pressure and flow rates may vary.

While the present invention has been illustrated by a description of various embodiments and while these embodiments have been described in considerable detail, it is not the intention of the Applicants to restrict or in any way limit the scope of the appended claims to such detail. Additional advantages and modifications will readily appear to those skilled in the art. The invention in its broader aspects is therefore not limited to the specific details, representative apparatus and method, and illustrative example shown and described. This has been a description of the present invention, along with the preferred method of practicing the present invention as currently known. However, the invention itself should only be defined by the appended claims, wherein we claim:

1. A method of forming a conformal titanium nitride film in a plug in a substrate to prevent the reaction of fluorine with titanium comprising:

providing a silicon substrate having an upper surface;

forming an oxide layer on the upper surface of the silicon substrate, the oxide layer having a top surface and apertures from the top surface to the upper surface of the silicon substrate exposing the upper surface of the substrate;

forming concurrently by chemical vapor deposition a Ti layer on the oxide layer and a titanium suicide layer with the exposed upper surface of the silicon substrate; and thereafter converting the titanium layer to a titanium nitride layer by subjecting the titanium layer to a nitrogen containing plasma.

2. The method of claim 1, wherein the titanium silicide layer is at least twice the thickness of the Ti layer on the top surface of the oxide layer.

3. The method of claim 1, wherein the apertures include substantially vertical walls extending from the top surface of the oxide layer to the upper surface of the silicon substrate.

4. The method of claim 3, wherein the thickness of the titanium layer on the top surface of the oxide layer is greater than the thickness of the titanium layer on the vertical walls of the aperture.

5. The method claimed in claim 1, wherein the substrate is heated to a temperature of 350° C. to 700° C. and maintained at said temperature throughout all of the reaction steps.

6. The method of claim 1, wherein the formation of the titanium layer and the formation of the titanium nitride are performed in a single reaction chamber without removing the substrate from the chamber.

7. The method claimed in claim 6, wherein the substrate is heated to a temperature of 350° C. to 700° C. and maintained at the temperature throughout all of the reaction steps.

8. The method of claim 1, further comprising the step of depositing a layer of tungsten over the titanium nitride layer by chemical vapor deposition of $WF_6$.

9. The method of claim 1, wherein the titanium layer is formed by chemical vapor deposition from a titanium tetrahalide source gas.

10. The method of claim 1, wherein the nitrogen containing plasma is selected from the group consisting of ammonia, $N_2$ or $NH_3/N_2$ based plasma.

11. The method of claim 1, further comprising the step of forming a tungsten layer over the titanium nitride and titanium silicide by subjecting the substrate to tungsten hexafluoride and hydrogen.

12. The method of claim 1, further comprising the step of subjecting the titanium layer to a hydrogen/argon plasma prior to forming the titanium nitride on the titanium layer.

13. The method of claim 1, wherein a pressure in the range of 0.5 to 10 torr is established in the reaction chamber and the pressure is maintained in the range throughout all of the reaction steps.

14. The method of claim 1, wherein the apertures in the oxide layer are selected from the group consisting of holes and vias.

15. The method of claim 14, wherein the holes or vias expose the upper surface of the silicon substrate and form interconnects.

16. The method of claim 1 further comprising the step of depositing a layer of tungsten over the titanium nitride layer by subjecting the titanium nitride layer to a plasma treatment and then injecting $H_2$ and $WF_6$ into a CVD process chamber having the substrate mounted therein while maintaining conditions effective to produce a reduction reaction resulting in deposition of the layer of tungsten onto the plasma treated titanium nitride layer.

17. A method of forming a conformal titanium nitride film in a plug in a substrate to prevent the reaction of fluorine with titanium comprising:

placing a silicon substrate having an oxide layer formed thereon in a reaction chamber;

forming a single titanium layer on the oxide layer by chemical vapor deposition from a titanium tetrahalide source gas;

subjecting the single titanium layer to a nitrogen containing plasma to convert the single titanium layer to a single titanium nitride layer, in the same reaction chamber as the forming step, without removing the substrate from the chamber;

depositing a layer of tungsten over the single titanium nitride layer by chemical vapor deposition of a fluoridated tungsten source gas.

18. The method claimed in claim 17, wherein the substrate is heated to a temperature of between about 350° C. and about 700° C. and maintained at the temperature throughout the forming and subjecting steps.

19. The method of claim 17, wherein the steps of forming the titanium layer, forming of the titanium nitride layer and depositing the tungsten layer are performed in a single reaction chamber without removing the substrate from the chamber.

20. The method claimed in claim 19, wherein the substrate is heated to a temperature of 350° C. to 700° C. and maintained at the temperature throughout all of the steps.

21. The method of claim 17, wherein the fluoridated tungsten source gas includes $WF_6$.

22. The method of claim 17, wherein the titanium tetrahalide source gas includes $TiCl_4$.

23. The method of claim 17, wherein nitrogen containing plasma is selected from the group consisting of ammonia, an $N_2$ or an $NH_3/N_2$ based plasma.

24. The method of claim 17, further comprising the step of subjecting the titanium layer to a hydrogen/argon plasma prior to forming the titanium nitride on the titanium layer.

25. The method of claim 17, wherein a pressure in the range of 0.5 to 10 torr is established in the reaction chamber and the pressure is maintained in the range throughout the forming and subjecting steps.

26. The method of claim 17, wherein a pressure in the range of 0.5 to 10 torr is established in the reaction chamber and the pressure is maintained in the range until all steps have been performed.

27. The method of claim 17, wherein the oxide layer has apertures including substantially vertical walls extending upwardly from an exposed surface of the substrate to a top surface of the oxide layer.

28. The method of claim 27, wherein the thickness of the titanium layer on the top surface of the oxide layer is greater than the thickness of the titanium layer on the walls of the aperture.

29. The method of claim 27 wherein the apertures in the oxide layer are selected from the group consisting of holes and vias.

30. The method of claim 29 wherein the holes or vias form interconnects.

31. The method of claim 27 wherein the exposed surface of the silicon substrate forms a titanium silicide layer during the step of forming the titanium layer, and wherein the thickness of the titanium silicide layer is greater than the thickness of the titanium layer on the oxide layer.

32. The method of claim 17 wherein the step of depositing the layer of tungsten includes subjecting the titanium nitride layer to a plasma treatment and injecting $H_2$ and $WF_6$ into a CVD process chamber having the substrate mounted therein while maintaining conditions effective to produce a reduction reaction resulting in deposition of the layer of tungsten onto the plasma treated titanium nitride layer.

* * * * *

UNITED STATES PATENT AND TRADEMARK OFFICE
CERTIFICATE OF CORRECTION

PATENT NO.    : 6,093,645
DATED         : July 25, 2000
INVENTOR(S)   : Gary Worden It is certified that error appears in the above-identified patent and that said Letters Patent is hereby corrected as shown below:

Column 8,
Line 15 (claim 1, line 11), please delete "suicide" and replace with -- silicide --;

Signed and Sealed this

Ninth Day of October, 2001

*Attest:*

NICHOLAS P. GODICI
*Attesting Officer*    *Acting Director of the United States Patent and Trademark Office*

UNITED STATES PATENT AND TRADEMARK OFFICE
CERTIFICATE OF CORRECTION

PATENT NO.    : 6,093,645
DATED         : July 25, 2000
INVENTOR(S)   : Ameen et al.

It is certified that error appears in the above-identified patent and that said Letters Patent is hereby corrected as shown below:

<u>Column 8,</u>
Line 15 (claim 1, line 11), please delete "suicide" and replace with -- silicide --;

This certificate supersedes Certificate of Correction issued October 9, 2001.

Signed and Sealed this

Tenth Day of June, 2003

JAMES E. ROGAN
*Director of the United States Patent and Trademark Office*